(12) United States Patent
Zeng et al.

(10) Patent No.: US 6,797,341 B2
(45) Date of Patent: Sep. 28, 2004

(54) METHOD FOR PRODUCING BORIDE THIN FILMS

(75) Inventors: Xianghui Zeng, State College, PA (US); Alexej Pogrebnyakov, State College, PA (US); Xiaoxing Xi, State College, PA (US); Joan M. Redwing, State College, PA (US); Zi-Kui Liu, State College, PA (US); Darrell G. Schlom, State College, PA (US)

(73) Assignee: Penn State Research Foundation, University Park, PA (US)

( * ) Notice: Subject to any disclaimer, the term of this patent is extended or adjusted under 35 U.S.C. 154(b) by 0 days.

(21) Appl. No.: 10/395,892

(22) Filed: Mar. 25, 2003

(65) Prior Publication Data
US 2003/0219911 A1 Nov. 27, 2003

Related U.S. Application Data
(60) Provisional application No. 60/367,815, filed on Mar. 25, 2002.

(51) Int. Cl.[7] .............................. B05D 3/00; C23C 16/00
(52) U.S. Cl. .................... 427/585; 427/62; 427/586; 427/593; 427/596; 427/255.28; 427/255.38; 29/599
(58) Field of Search ................. 427/255.28, 255.38, 427/62, 561, 586, 593, 596; 505/470; 29/599

(56) References Cited

U.S. PATENT DOCUMENTS

| | | | |
|---|---|---|---|
| 3,791,852 A | * | 2/1974 | Bunshah ..................... 427/567 |
| 3,949,119 A | | 4/1976 | Shewchun et al. |
| 5,032,571 A | | 7/1991 | Takemura |
| 6,514,557 B2 | | 2/2003 | Finnemore et al. |
| 6,579,360 B2 | | 6/2003 | Balachandran et al. |
| 2002/0132739 A1 | * | 9/2002 | Kang et al. .................. 505/123 |
| 2002/0173428 A1 | * | 11/2002 | Thieme et al. .............. 505/100 |

OTHER PUBLICATIONS

Bunshah et al., "Deposition Technologies for films and coatings", copyright 1982, pp. 122–127.*

Saito et al., As–Grown Deposition of Superconducting MgB2 Thin Films by Multiple–Target Sputtering Systems, Jpn. J. Applied Phys, vol. 41 (2002) pp. L127–L129 (publication Dec. 6, 2001).*

(List continued on next page.)

*Primary Examiner*—Brian K. Talbot
(74) *Attorney, Agent, or Firm*—McDermott Will & Emery LLP

(57) ABSTRACT

Thin films of conducting and superconducting materials are formed by a process which combines physical vapor deposition with chemical vapor deposition. Embodiments include forming boride films, such as magnesium diboride, in high purity with superconducting properties on substrates typically used in the semiconductor industry by physically generating magnesium vapor in a deposition chamber and introducing a boron containing precursor into the chamber which combines with the magnesium vapor to form a thin boride film on the substrate.

15 Claims, 7 Drawing Sheets

OTHER PUBLICATIONS

Saito et al., "As Grown MgB2 thin films depsoited on Al2O3 substartes with different cyystal planes", Superconductor Scinece and Technology, vol. 15 (2002), pp. 1–5.*

Saito et al., "Low–temperature fabrication of as–grown MgB2 thin films by co–vapor deposition method", Jpn, Applied Physics, No. 62, Sep. 12, 2001.*

T. He et al., "Reactivity Of $MgB_2$ With Common Substrate And Electronic Materials", Applied Physics Letters, Jan. 14, 2002, vol. 80, No. 2, pp. 291–293.

Zi–Kui Liu et al., "Computational Thermodynamic Modeling Of The Mg–B System", *Calphad*, 2001, vol. 25, No. 2, pp. 299–303.

Kenneth Chang "Rapid New Understanding Of Superconducting Compound", Sep. 3, 2002, The New York Times.

Philip Ball "Smooth Step to Superconducting Devices", Sep. 3, 2002, Nature News Service.

Liu Chun "Peking University '87 Ph.D Xi Xiaoxing Develops Method for Making Films of $MgB_2$", Sep. 25, 2002, News Center of Peking University.

Sara Graham "Scientists Develop New Method of Manufacturing Superconducting Magnesium Boride", Sep. 4, 2002, American Scientific.com.

"Neue Theorie fur Supraleiter", Mar. 6, 2003, Wissenshaft.

"In situ epitaxial $MgB_2$ thin films for superconducting electronics", Xianghui Zeng, et al., nature materials, vol. 1. Sep., 2002, pp. 1–3, www.nature.com/naturematerials.

"Magnesium Diboride, Superior thin films", John Rowell, nature material, vol. 1, Sep., 2002, pp. 5–6, www.nature.com/naturematerials.

"Themodynamics of the Mg–B system: Implications for the deposition of $MgB_2$ thin films", Li–Kui Liu, et al., Applied Physics Letters, vol. 78, No. 23, Jun. 4, 2001, pp. 3678–3680.

"Superior Superconducting Films of $MgB_2$", Ron Dagani, C&EN: Today's Headlines, Sep. 9, 2002, vol. 80, No. 36, CENEAR 80 36, p. 11, ISSN 0009–2347, pp.1–2.

* cited by examiner

METHOD FOR PRODUCING BORIDE THIN FILMS

RELATED APPLICATION

The present application claims priority to U.S. Provisional Application Serial No. 60/367,815 filed Mar. 25, 2002 and entitled "HYBRID PHYSICAL-CHEMICAL VAPOR DEPOSITION OF MAGNESUM DIBORIDE AND OTHER BORIDE FILMS", the entire disclosure of which is hereby incorporated in its entirety herein by reference.

FIELD OF THE INVENTION

The present invention relates to boride thin films and methods of their formation and, in particular, to magnesium diboride thin films for use in superconducting electronics such as superconducting integrated circuits, in coated-conductor tapes, and other applications using superconductor thin films.

BACKGROUND

Integrated circuits using superconductors are more suitable for ultrafast processing of digital information than semiconductor-based circuits. Niobium (Nb) based superconductor integrated circuits using rapid single flux quantum (RSFQ) logic have demonstrated the potential to operate at clock frequencies beyond 700 GHz. However, the Nb-based circuits must operate at temperatures close to 4.2 Kelvin (K), which requires heavy cryocoolers with several kilowatts of input power, which is not acceptable for most electronic applications. Circuits based on high temperature superconductors (HTS) would advance the field, but 17 years after their discovery, reproducible HTS Josephson junctions with sufficiently small variations in device parameters have proved elusive.

The success in HTS Josephson junctions has been very limited due to the short coherence length, about 1 nm, in the HTS materials.

The newly-discovered superconductor material magnesium diboride ($MgB_2$) holds great promise for superconducting electronics, in part, because of its relatively high transition temperature ($T_c$), at which temperature the respective material becomes superconducting and changes in electrical resistance from a finite value to zero. This temperature for $MgB_2$, in bulk, can be as high as 39 K. Like the conventional superconductor Nb, $MgB_2$ is a phonon-mediated superconductor with a relatively long coherence length, about 5 nm. These properties make the prospect of fabricating reproducible uniform Josephson junctions more favorable for $MgB_2$ than for other high temperature superconductors. A $MgB_2$-based circuit can operate at about 25 K, achievable by a compact cryocooler with roughly one-tenth the mass and the power consumption of a 4.2 K cooler of the same cooling capacity. Furthermore, since the ultimate limit on device and circuit speed depends on the product of the junction critical current, $I_c$, and the junction normal-state resistance, $R_n$, and since $I_c R_n$, is proportional to the energy gap of the superconductor, the larger energy gap in $MgB_2$ could lead to even higher speeds (at very high values of critical current density) than in Nb-based superconductor integrated circuits.

A problem encountered in depositing $MgB_2$ thin films, however, is that a very high Mg vapor pressure is necessary for the thermodynamic stability of the $MgB_2$ phase at elevated temperatures. There are three types of techniques currently used for $MgB_2$ film deposition: 1) Co-evaporation of Mg and B in high vacuum below 320° C.; 2) Low temperature deposition of Mg—B or Mg—$MgB_2$ mixture by pulsed laser deposition (PLD) or thermal evaporation, followed by an in situ annealing in the growth chamber; 3) Ex situ annealing of B films, made by PLD or sputtering, at 900° C. under a Mg vapor. The films deposited by these technologies either have reduced $T_c$, poor crystallinity, and/or require an additional step of ex situ annealing in Mg vapor. Further, the surfaces of these films are rough and non-stoichiometric, all of which is undesirable for Josephson junction devices.

Accordingly, a continuing need exists for the efficient manufacture of thin films of superconductors, in particular boride thin films in high throughput and purity.

BRIEF SUMMARY

Advantages of the present invention are thin film materials and methods for their manufacture.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method which combines physical vapor deposition with chemical vapor deposition. The method comprises introducing or providing a substrate, i.e., a substrate typically used in fabricating semiconductors, into a chamber. The method further includes physically generating vapor from at least one source material, which is within the chamber with the substrate. The vapor of the source material can be physically generated by, for example, heating the source material, ablating the source material, or by employing a pulsed laser upon the source material thereby physically generating vapor of the source material in the chamber. Advantageously, the source material is in close proximity to the substrate to facilitate formation of the thin film.

The method additionally includes introducing at least one precursor to the chamber. The precursors combined with the vapor from the at least one source material to form a thin film of the combined precursor and source material on the substrate. Typically, the vapor from the precursor material and source material combine by chemical reaction to form a thin film that comprises both constituents of the source material and constituents of the precursor. However, physical combinations of the two are also contemplated.

Embodiments of practicing the present invention include physically generating vapor from a source material including magnesium, calcium, titanium or alloys thereof; introducing a boron containing precursor to the chamber; introducing a carrier gas; e.g., hydrogen and/or nitrogen; and forming a boride metal film on the substrate.

Another aspect of the present invention is a thin film suitable for use in semiconductor applications. In an embodiment of the present invention, a magnesium diboride film having high purity, low roughness, and high critical temperature is combined with a substrate.

Additional advantages of the present invention will become readily apparent to those skilled in this art from the following detailed description wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

The various features and advantages of the present invention will become more apparent and facilitated by reference to the accompanying drawings, submitted for purposes of illustration and not to limit the scope of the invention, where the same numerals represent like structure and wherein.

DESCRIPTION OF THE INVENTION

Figure 1:
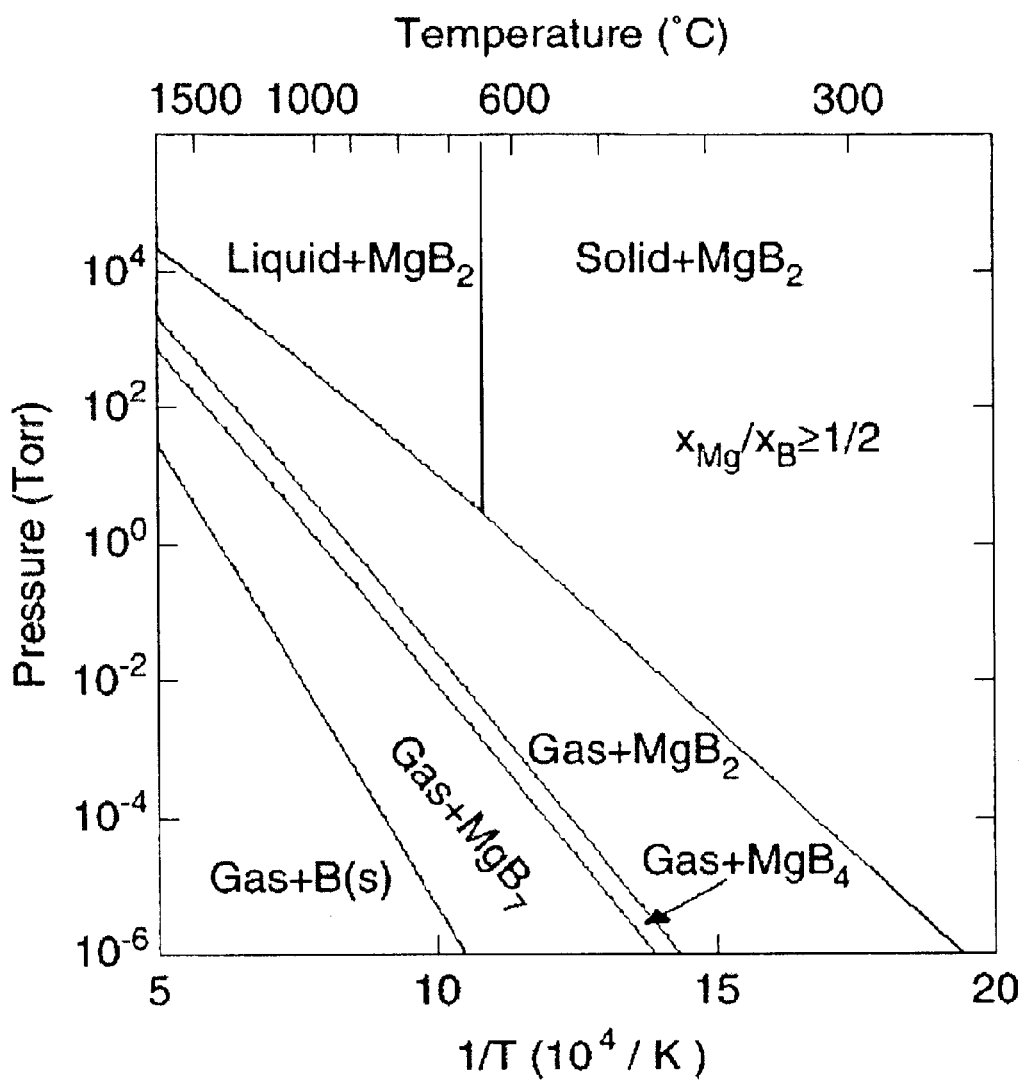
FIG. 1 shows a pressure-temperature phase diagram calculated for depositing a magnesium diboride film on a substrate. The region of "gas+MgB$_2$" represents the thermodynamic stability window for the deposition of a magnesium diboride thin film.

The present invention contemplates forming thin films by combining the techniques, in part, of a physical vapor deposition (PVD) process with that of a chemical vapor deposition (CVD) process. This hybrid physical chemical vapor deposition (HPCVD) process addresses various problems arising in fabricating thin films of superconducting materials, which often need high purity and morphological integrity for efficient superconducting properties and which are not readily achieved by either PVD or CVD individually.

Although the present invention is suited for depositing superconducting materials, other thin film materials are also contemplated. The present methods can achieve forming high purity films by reducing or eliminating the need for organometallic compounds, as is typically used in CVD or metalorganic CVD (MOCVD). The metal or metal source is provided by physically generating vapor from a source material, such as practiced with PVD. A separate precursor is combined with the source vapor to form the film. It is understood that the combination of the source vapor and precursor is typically by a chemical reaction between the two, but the present invention is not so limited.

In one aspect of practicing the present invention, a substrate is placed in a reaction chamber of an HPCVD system. The substrate can be those that are typically used in the semiconductor industry, but any substrate can potentially be used in this system. Vapor from at least one source material, which is within the chamber with the substrate, is then physically generated. The vapor can be generated by thermally heating the source material, by oblating the source material, or by using a pulse laser to generate vapor of the source material. The source material is typically a metal or metal alloy such as magnesium, titanium, calcium, lanthanide, strontium, a lanthanide metal, alloys thereof, etc. Vapor from the source material is combined with a precursor which is introduced to the chamber during physical generation of the vapor of the source material.

Any number of precursors can be used in practicing the present invention. However, the present invention is particularly applicable to forming boride films from boride containing precursors. Borides are a family of materials with many different functionalities. These include superconductivity (e.g. MgB$_2$, T$_c$ of about 40K), high conductivity metal (e.g. TiB$_2$, ρ of approximately 10 Ωcm), semiconductor (e.g. CaB$_6$, Eg 0.8 eV), thermoelectric and thermionic materials (e.g. LaB$_6$), magnetic semiconductor (e.g. CaB$_6$ and SrB$_6$), and magnetic superconductor (e.g. ReRh$_4$B$_4$). The HPCVD technique can be readily applied to the deposition of other boride materials, and for the deposition of heterostructures of borides, which can lead to new multifunctional electronic devices. Examples of boron containing precursors includes boranes and substituted boranes, such as diborane, boron trichloride, boron tribromide, boron trifluoride, trimethylboron, etc.

To better understand the optimum conditions needed for forming thin films, and understanding of the thermodynamics of the source material and precursor material during thin film deposition is helpful. For example, it has been demonstrated for numerous materials containing a volatile constituent that an understanding of the thermodynamics of the system can help identify the appropriate growth regime for such materials. Although MgB$_2$ has been known and structurally characterized since the mid 1950's, detailed thermodynamic information is limited. However, the thermodynamic behavior can be this system can be studied. Thermodynamic analysis and calculation of phase diagrams (CALPHAD) can be achieved with known software programs and known methods. See, e.g., Z. K. Liu et al. "Computational Thermodynamic modeling of Mg—B System" CALPHAD 2001:25:299–303; Z. K. Liu et al. "Thermodynamics of the Mg—B system: Implications for the Decomposition of MgB2 thin Films" Appl. Phys. Lett. 2001:78:3678–3680.

For example, in a Mg—B system, there are three intermediate compounds, MgB$_2$, MgB$_4$ and MgB$_7$, in addition to gas and the solution phases, i.e. liquid, hcp magnesium, and β-rhombohedral boron. Using the aforementioned procedure, the Gibbs energies of formation are obtained for the three compounds, from which a pressure-temperature phase diagram is calculated and shown in FIG. 1. The deposition of a single-phase MgB$_2$ film becomes easy when the growth conditions fall within a window where the thermodynamically-stable phases are the desired MgB$_2$ phase and gas phases (the "Gas+MgB$_2$" region shown in FIG. 1). For a given deposition temperature, one can find the Mg partial pressure range to keep the MgB$_2$ phase thermodynamically stable. As seen in the figure, this range extends over about three orders of magnitude. The boundaries of the growth window can be approximately expressed by the following equations: $\log(P)=-7561/T+8.673$ (the upper boundary with solid Mg), and $\log(P)-10142/T+8.562$ (the lower boundary with MgB$_4$), where P is in Torr and T in Kelvin.

The optimum temperature for epitaxial growth is typically about one half of the melting temperature, $T_m$, (in Kelvin), although the minimum temperature can be much lower. Thermodynamic calculations show that MgB$_2$ melts congruently at 2430° C. (about 2700 K) with an equilibrium vapor pressure exceeding 49000 Torr. Therefore, the optimum temperature for the deposition of epitaxial $MgB_2$ films is around 1080° C. (about 1350 K). For $MgB_2$ to be stable at 1080° C., a Mg partial pressure of at least about 11 Torr is most preferred. Converting the Mg partial pressure to Mg flux, F, using the formula $F=P/\sqrt{2\pi m k_B T}$, where m is the mass of Mg atom, about 11 Torr is equivalent to a Mg flux of about $2\times10^{21}$ Mg atoms/(cm² s), or a Mg deposition rate of about 0.5 mm/s, provided all the Mg atoms stick and form a Mg layer with bulk density. This is practically not feasible for most thin film deposition techniques. A deposition temperature of about 850° C. corresponds to a Mg overpressure of about 340 mTorr, or a Mg flux of $6\times10^{19}$ Mg atoms/(cm² s), or a Mg deposition rate of about 15 $\mu$m/s. For 600° C., the necessary Mg overpressure is about 0.9 mTorr, which corresponds to a Mg Flux of $2\times10^{17}$ Mg atoms/(cm² s), or a Mg growth rate of about 500 Å/s.

Figure 2:
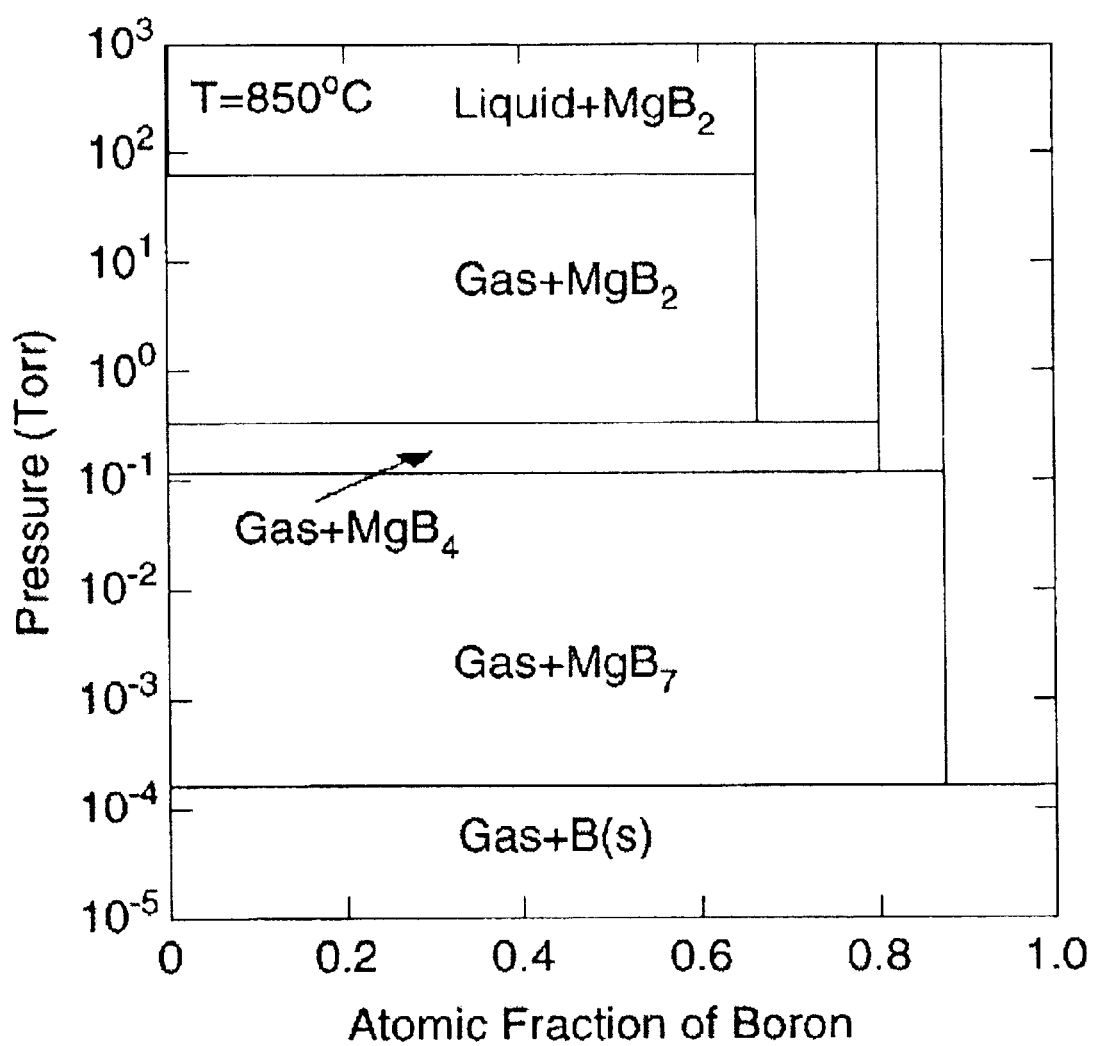
FIG. 2 illustrates a pressure-composition phase diagram of a magnesium-boron system at 850° C.

The pressure-composition phase diagram of $MgB_2$ at 850° C. is shown in FIG. 2 and the growth window is marked by "Gas+$MgB_2$". Again, the Mg partial pressure is preferably high (above 340 mTorr) to keep $MgB_2$ thermodynamically stable. In terms of the Mg:B ratio, as long as it is above the stoichiometric 1:2, any amount of extra Mg above stoichiometry will be in the gas phase and be evacuated and the desired $MgB_2$ phase will result. This is the automatic composition control that accompanies the adsorption-controlled growth of films containing volatile species from a source material.

It has been shown that a significant kinetic barrier to the thermal decomposition of $MgB_2$ exists. In other word, $MgB_2$ does not decompose as easily as predicted by the thermodynamics. However, oxygen contamination during deposition reacts with Mg, which effectively reduces the Mg pressure. Further, the sticking coefficient of Mg decreases dramatically when the substrate temperature increases above 300° C. If there is not enough Mg at the substrate to react with a boron containing precursor, $MgB_2$ cannot be formed. Therefore, it is a general principle that a high Mg pressure is preferred for the in situ deposition of $MgB_2$ thin films.

Although the foregoing discussion is most applicable to forming a magnesium diboride film, other materials can likewise be analyzed and the most optimum processing conditions determined.

Hybrid Physical Chemical Vapor Deposition Apparatus

Figure 3:
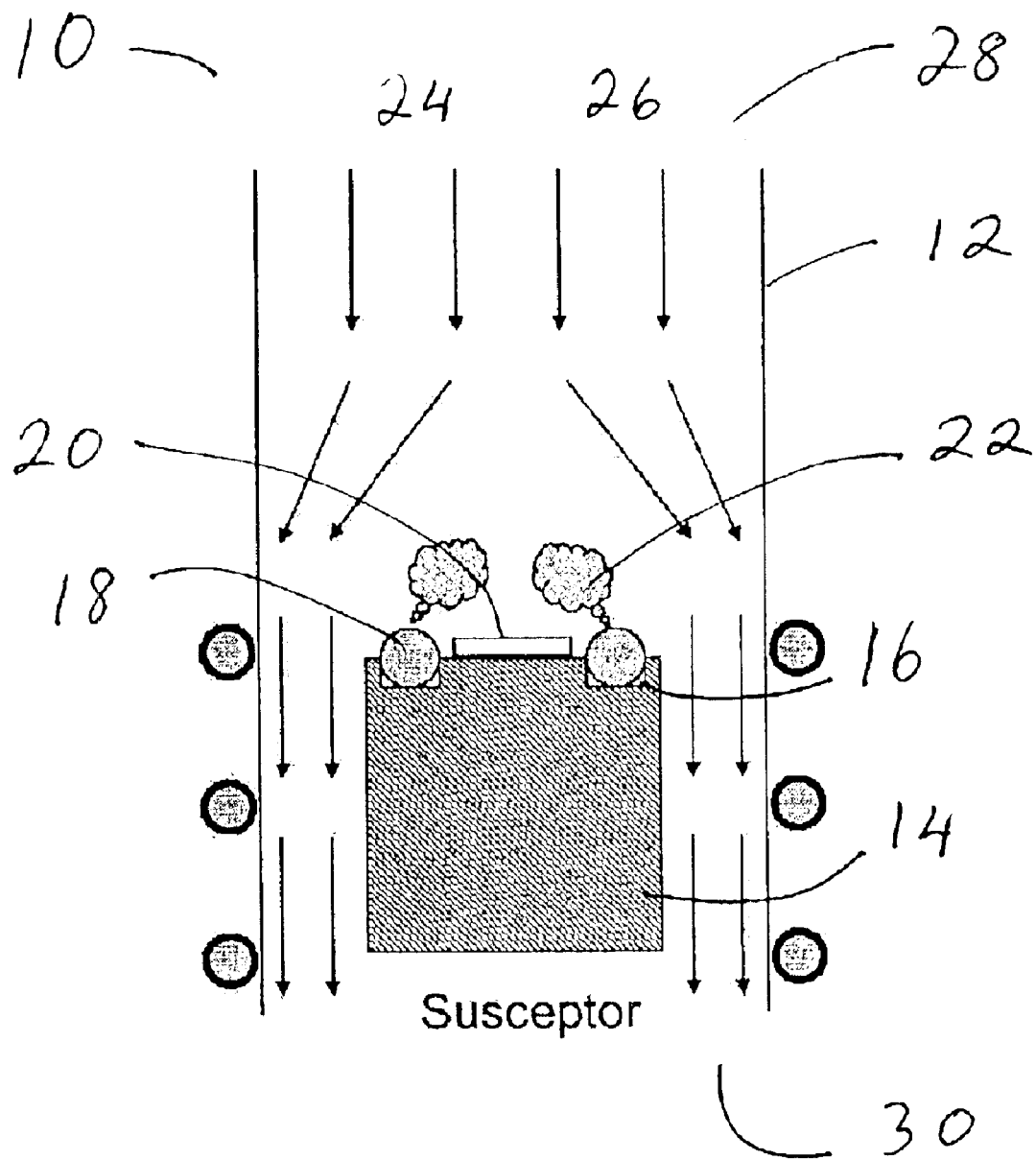
FIG. 3 is a schematic view of an apparatus that can be employed to practice an aspect of the present invention.
Figure 4:
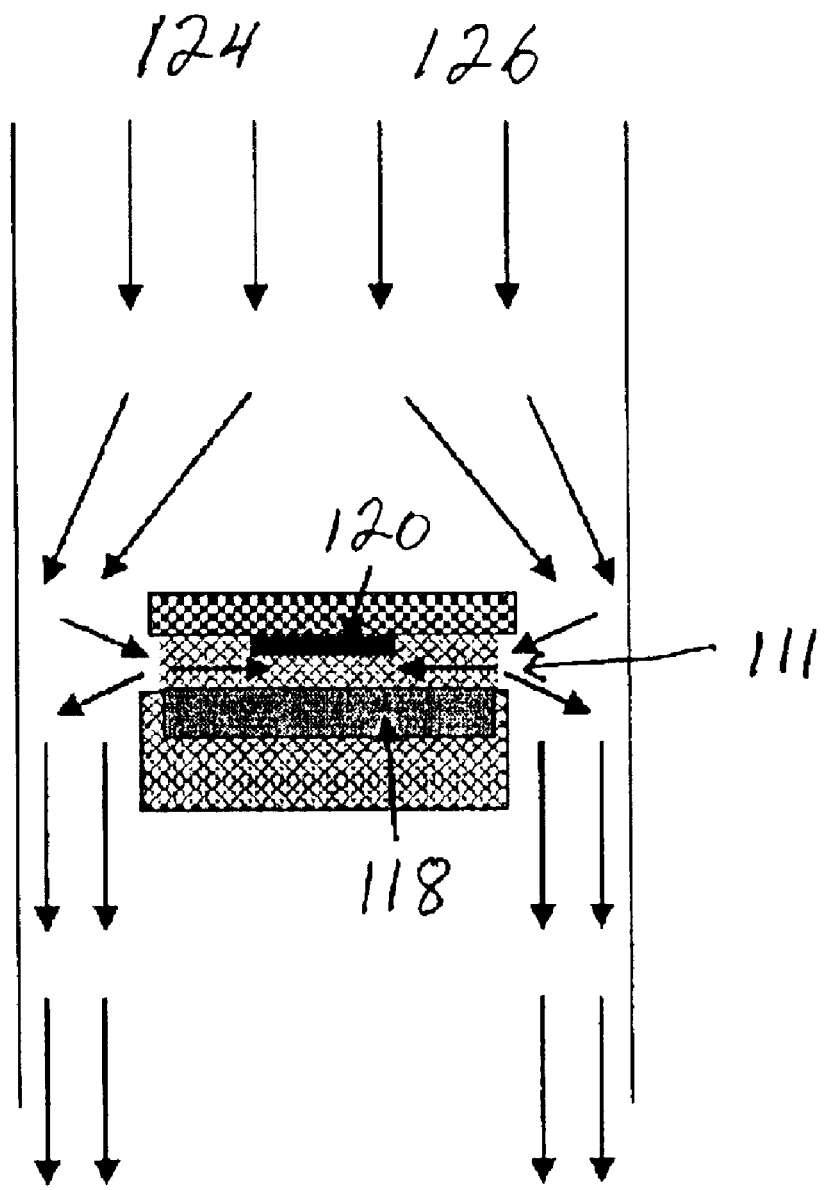
FIGS. 4 and 5 are schematic views of alternative apparatuses that can be employed to practice aspects of the present invention.
Figure 5:
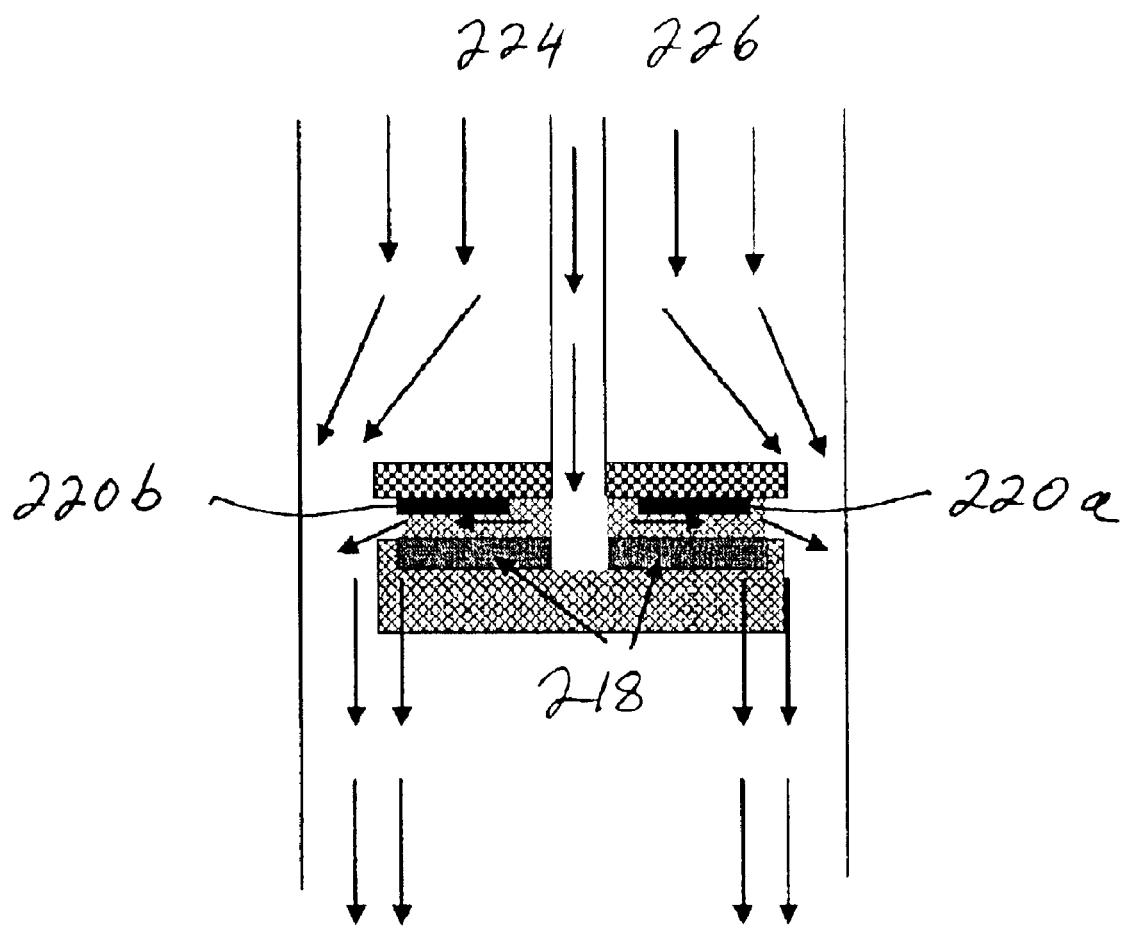

In practicing one aspect of the invention, an HPCVD apparatus is described, which can take physical form in certain parts and arrangements of parts. In FIGS. 3–5, several HPCVD systems are illustrated. As shown in FIG. 1, system 10 includes a water cooled vertical quartz tube reactor chamber 12. In this example, chamber 12 has an inner diameter of about 37.5 mm. The chamber can be maintained at any appropriate pressure, as determined by thermodynamic analysis. In an embodiment, the pressure is maintained at about 1–1000 Torr, e.g., about 100–700 Torr. Susceptor 14 is placed coaxially inside chamber 12 as shown. The susceptor can be made from a SiC-coated graphite, Mo, stainless steel or any other suitable material. In this example the susceptor is a SiC-coated graphite with a flat top surface, and is about 22 mm in diameter. It has retaining groove 16 in which bulk pieces of source material 18, such as 3–4 pieces of Mg cut from an Mg ingot and weighing about 0.3–0.4 grams each, can be placed.

In this example, the source material is in the chamber and in close proximity to substrate 20, which is atop suseptor 14. With an outer diameter of 18 mm, the suseceptor can accommodate a substrate having dimensions of about 5 mm×5 mm in size, when placed in the center of the top surface of the susceptor. Susceptor 14 can be heated, for example, by an inductance heater (not shown for illustrative convenience). The susceptor can be heated to any appropriate temperature to thermally general vapor of the source material. In one embodiment, the temperature of this susceptor is maintained between about 20° C. to 1200° C., e.g., from about 20° C. to about 900° C.

The power needed to heat a susceptor to the deposition temperature of above 700° C. depends on the susceptor composition and, if present, a carrier gas and is of the order of about 1 kW. Heating the suseptor, and/or operating the HPCVD system physically generates vapor 22 of source material 18. In this example the vapor is that from Mg. Carrier gas 24, such as $H_2$, and boron precursor 26 can be introduced into chamber 12 simultaneously or individually and at different times from one another and at various flow rates. In one example, about 1000 ppm of $B_2H_6$ in $H_2$ are introduced from top 28 of chamber 12 as a gaseous mixture, and exhausted from bottom 30 of the reactor chamber 12.

Further improvements and flexibility in forming thin films is contemplated by employing different HPCVD configurations. For example, different system configurations would allow independent control over the substrate and source material's temperatures and could be achieved by two independent heater/controllers—one for the substrate and one for the source material. This would increase the range of the growth parameters. Reduced substrate temperatures may also be desirable for the fabrication of multilayer semiconductor structures and junctions where diffusion of components between layers during growth of the thin film at elevated temperature is a concern.

Additionally, films with larger areas and thicknesses can be fabricated reproducibly, and with uniform morphology by varying the distribution of vapor from the source material and precursor. This can be achieved, for example, by varying the position of the source material with respect to the substrate.

FIGS. 4–5 are HPCVD systems that enable independent control of the source material temperature and substrate temperature and also provide a uniform flux of source material vapor and precursor to the surface of the substrate. FIG. 4 includes a narrow clearance 111 between the source source 118 and substrate 120, which forms a growth cell. This design has previously been used for the sublimation growth of GaN from Ga vapor and $NH_3$. See, for example P. G. Baranov, et al., "Current status of GaN crystal growth by sublimation sandwhich technique", MRS Internet J. Nitride Semicond. Res. 3, 50 (1998). The flux of vapor from source source 118 in the growth cell is controlled by a temperature gradient between the source and substrate and the distance between them. This distance can be from about several mm to several inches. A potential disadvantage of this design is a non-uniform supply of precursor to the growth surface due to the narrow channel of the growth cell, which limits gases to the center of substrate.

An alternative design, shown in FIG. 5, incorporates a horizontal flow of precursor 226 across substrate surface 220a and 220b to facilitate a high concentration of precursor vapor across the substrates' surface. The source material 218 can also be enclosed within a purged crucible. The carrier gas 224 in this case, can be used to enhance the convective transport of source material vapor 222 to the surface and provide a means to turn on and off the supply of this source.

Modifications of the above reactor designs or other reactor designs may be made to improve the flow and mixing of the source material's vapor with the precursor. The effect of growth conditions on the growth rate, thickness uniformity, surface morphology, crystallinity, purity and superconducting properties of the formed films can be controlled by adjusting various parameters employed in operating the HPCVD system. For example, it is expected that the substrate temperature will effect the growth rate and crystal quality of the films. In the case of $MgB_2$, $MgB_2$ has a high melting temperature (around 2700K), consequently, high growth temperatures are anticipated to enhance epitaxial growth of this material. The dependence of growth rate on temperature also provides information on the factors that control film growth (thermodynamics, kinetics, mass transport, etc.).

Temperature gradient and distance between substrate and source source will effect the flux of source vapor to the substrate. A large temperature gradient over a small distance would yield a high source flux. However, too small of a source substrate distance would inhibit transport to the surface of the substrate. An optimum separation and temperature profile for uniform film deposition can be identified by adjusting the source temperature, substrate temperature and distance between the two.

The effect of the precursor flow rate and the source/precursor ratio on the growth rate and film properties can be controlled by the precursor concentration in the reactor.

The initial growth of a film on the substrate, e.g., $MgB_2$ on sapphire and SiC substrates, can be such that promote two-dimensional growth of highly oriented films with large grain size and low surface roughness. For example, direct deposition of $MgB_2$ on SiC can be expected to yield epitaxial films with good crystallinity due to the small lattice mismatch between the two materials (0.42%). In the case of sapphire, however, the lattice mismatch is more substantial and buffer layers may be used to promote the formation of large nuclei and two-dimensional film growth.

The procedures and conditions of forming MgB2 films were as follows. The reactor is first purged with purified $N_2$ gas and purified $H_2$ gas for about 15 minutes each. The carrier gas during the deposition is 1 slm purified $H_2$ maintained at about 100 Torr. The susceptor, along with the substrate and Mg pieces, are then heated inductively to about 700–760° C. in the $H_2$ ambient. As the bulk Mg pieces are heated, most likely by both the susceptor and the induced current, to above 700° C., Mg vapor is generated. A $B_2H_6/H_2$ mixture is then introduced into the reactor to initiate growth. When the $B_2H_6$ gas is not flowing through the reactor, there is no film deposition because of the low sticking coefficient of Mg at high temperatures. Once the $B_2H_6$ gas begins to flow, a $MgB_2$ film starts to grow on the substrate. The deposition rate depends on the $B_2H_6$ supply, and is about 3 Å/s for a $B_2H_6$ gas mixture flow rate of about 25 sccm. The film growth is terminated by switching off the $B_2H_6$ gas before the bulk Mg pieces are completely evaporated, which takes about 10 minutes. The sample is then cooled in the $H_2$ carrier gas to room temperature in about 5–6 minutes.

The precise Mg vapor pressure during the deposition is not known. However, it is not important as long as it is above the minimum pressure necessary for the $MgB_2$ phase stability and as long as the Mg:B ratio is larger than 1:2 due to the automatic composition control in the adsorption-controlled growth. According to the thermodynamic phase diagram, the lower boundary of the growth window at 750° C. is about 44 mTorr. The value and distribution of the Mg vapor depends on several factors: the susceptor temperature, the position of the Mg piece with respect to the inductance heater coil (which influences the direct heating of the Mg by the heater), the total pressure in the reactor, the geometry of the susceptor, and the flow pattern of the carrier gas. Additionally, the flow pattern of the $B_2H_6$ gas mixture is also a factor for film uniformity.

Once the relatively high Mg pressure is achieved, the HPCVD technique produced excellent quality $MgB_2$ films. Films having a thickness of from about 50 Å and higher can be produced. Epitaxial growth was observed by x-ray diffraction for a $MgB_2$ film on a 4H—SiC substrate. The 0001 $MgB_2$ peaks were the only non-substrate peaks observed, indicating that the film was phase-pure with its c-axis oriented normal to the film surface. The full width at half maximum (FWHM) of the 0002 $MgB_2$ peak in 20 and ω (rocking curve) was 0.29° and 0.56°, respectively for the $MgB_2$ film. The c-axis lattice constants measured from the peak position were close to 3.52 Å, the same as the bulk lattice constant of $MgB_2$. The in-plane texture of the films was investigated by scanning an off-axis peak. In the azimuthal scan (ø scan) of the $MgB_2$ $10\bar{1}2$ reflection for the film ø=0° and was aligned parallel to $[1\ 1\ \bar{2}\ 0]$ direction of the SiC substrate. The periodically spaced peaks separated by 60° in the scans showed the six-fold hexagonal symmetry of the $MgB_2$ films and the presence of in-plane epitaxy. The in-plane lattice constant is 3.09 Å, which is the same as bulk $MgB_2$. The small lattice mismatch between the $MgB_2$ film and SiC substrate (0.42%) enables the hexagonal $MgB_2$ to grow directly on top of hexagonal SiC, resulting in an epitaxial orientation of $(0001)[1\ 1\ \bar{2}\ 0]MgB_2\ (0001)[1\ 1\ \bar{2}\ 0]SiC$.

It should be noted that in the bulk of the $MgB_2$ film no magnesium oxide (MgO) impurities were observed. These oxides are commonly seen in $MgB_2$ thin films grown by other techniques. Magnesium oxide regions appeared only with the alumina substrate and only in a very thin layer near the $MgB_2/Al_2O_3$ interface, which may be the result of oxygen diffusion out of the substrate. We attribute the minimal oxygen contamination to the reducing $H_2$ ambient. When the susceptor and bulk Mg are heated to 750° C., $H_2$ may effectively eliminates MgO on the Mg surface and suppresse MgO formation during growth.

The in situ deposited $MgB_2$ films have smooth surfaces. When measured by atomic force microscopy (AFM) over a 10 μm×10 μm area, the root-mean-square (RMS) roughness of $MgB_2$ films on both sapphire and SiC substrates are less than about 4 nm. According to AFM images of $MgB_2$ films over a 1 μm×1 μm area, the RMS roughness is about 4 nm for the film on sapphire and about 2.5 nm for the film on SiC. It is believed that this result is much smoother than any $MgB_2$ film surface identified so far. A scanning electron microscopy (SEM) image of a $MgB_2$ film on a sapphire substrate show hexagonal-shaped growth columns of different heights. Cross-section and plane-view TEM observations show that these columns have very smooth top surfaces, and they have the same crystallographic orientations. Both AFM and SEM results show that the typical growth columns have dimensions larger than about 100 nanometers.

Figure 6:
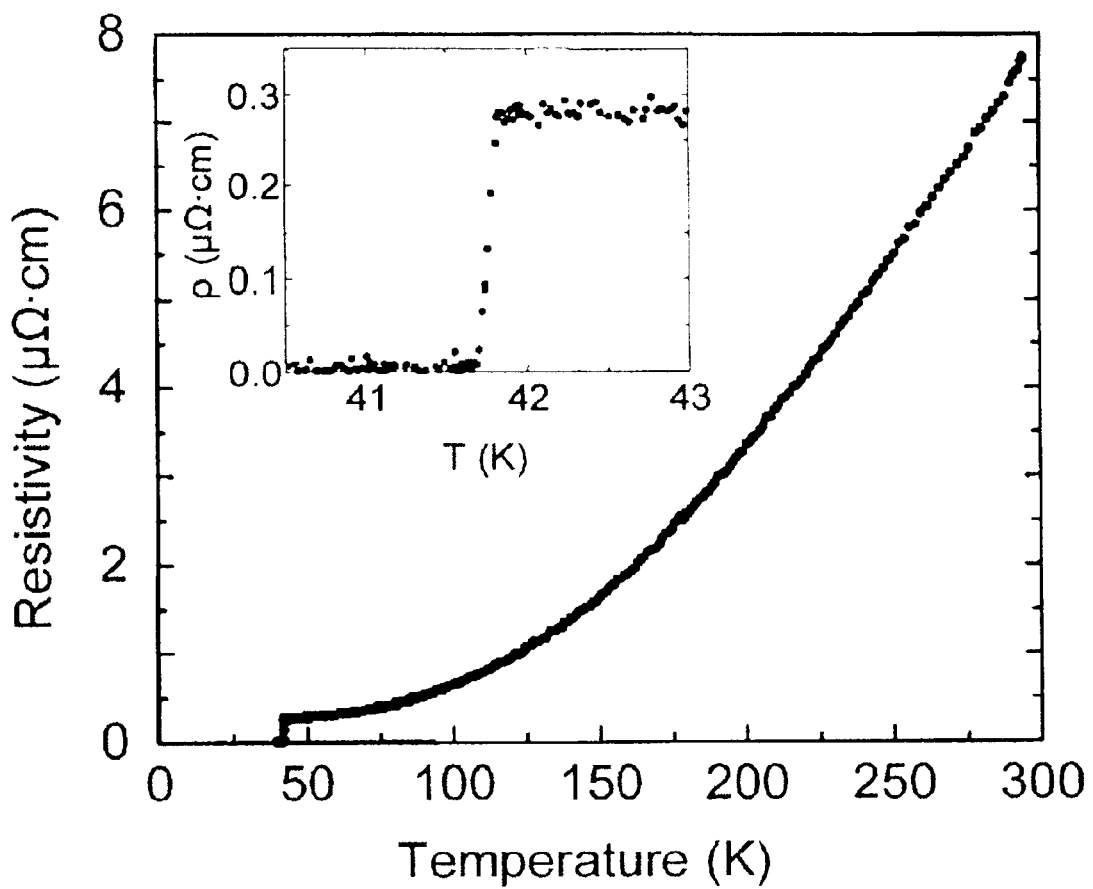
FIG. 6 is a graph depicting the resistivity versus temperature of a magnesium diboride film on substrates composed of 4H—SiC. The inset shows details near the superconducting transition temperature.
Figure 7:
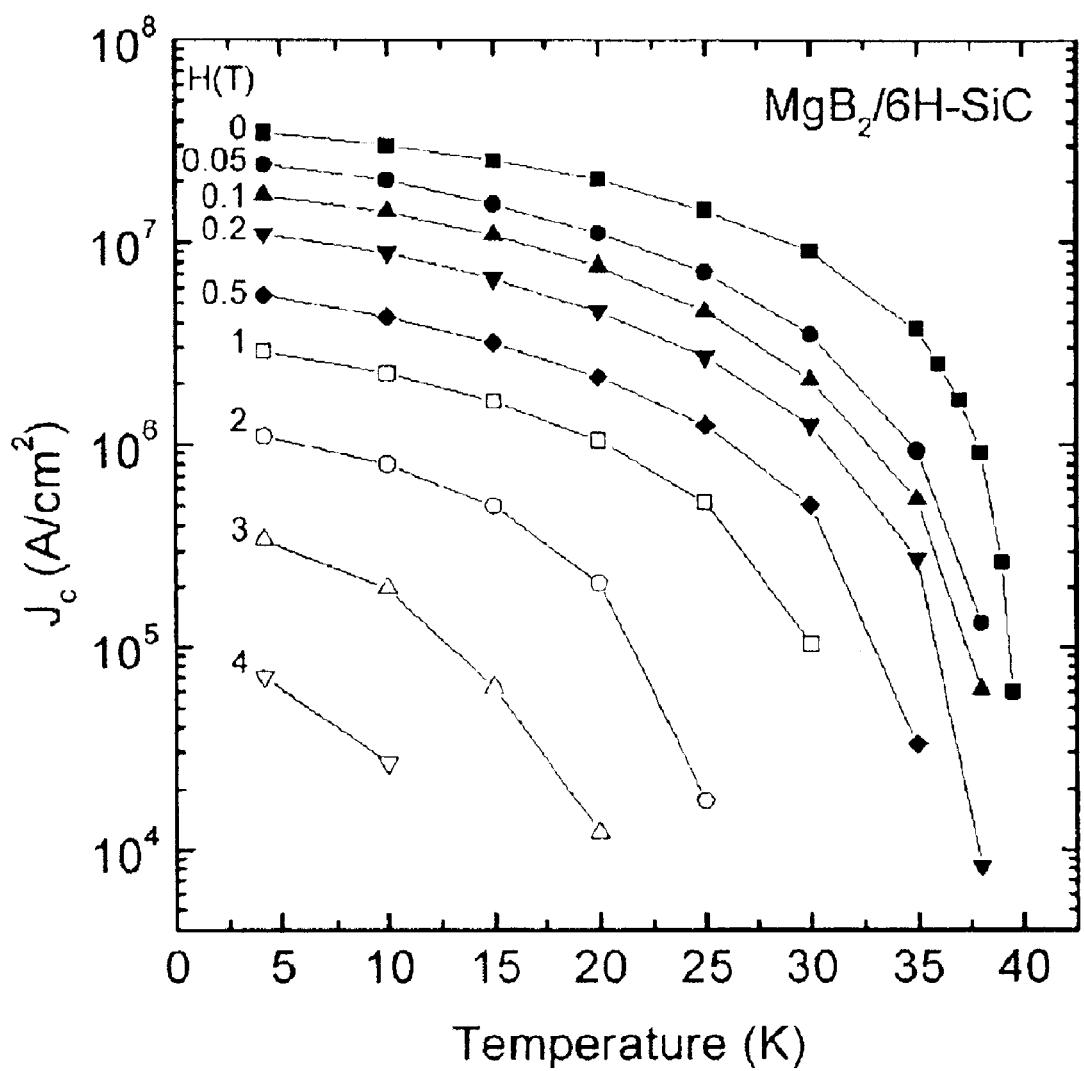
FIG. 7 is a chart depicting the critical current density (Jc) of a magnesium diboride film made in accordance with an aspect of the present invention on 6H—SiC substrates as a function of temperature and magnetic field.

The superconducting and transport properties of $MgB_2$ films are characterized by resistivity measurement using a standard four-point. Films were deposited ranging from about 2,000 Å to about 3,000 Å. A resistivity versus temperature plot of a 2,000 Å-thick $MgB_2$ film on a sapphire substrate showed a zero-resistance temperature $T_c$ of 39.3 K. A resistivity versus temperature plot of a $MgB_2$ films on 4H—SiC substrates showed a zero-resistance temperature $T_c$ of greater than 41 K. FIG. 6 shows resistivity versus temperature curves for a $MgB_2$ film on a (0001) 4H—SiC substrate. The inset shows the details near the superconducting transition temperature. The film has a zero-resistance $T_c$ above 40K, which is even higher than that in the bulk. In this particular example, the zero-resistance temperature was above 41 K, i.e., about 41.8 K. Moreover, the resistivity of the film is low, about 1.0 $\mu\Omega$cm before the superconducting transition. The residual resistance ratio RRR=R(300 K)/R(45 K) is about 13. This value is similar to high quality bulk samples, indicating very clean films with good crystallinity. This kind of values for $T_c$, resistivity, and RRR are repeatedly obtained for $MgB_2$ films on SiC and sapphire substrates by practicing HPCVD as described herein.

In addition to the excellent structural and superconducting properties, the $MgB_2$ films deposited by HPCVD have smooth surfaces. The process is compatible with multilayer device fabrication and easy to scale up.

In addition to the high $T_c$ and low resistivity shown in FIG. 6, the transport critical current density $J_c$ for a $MgB_2$ film on 6H—SiC substrate is shown in FIG. 8 as a function of temperature and applied magnetic field. It was measured on a 20-$\mu$m wide bridge using a Quantum Design PPMS system with a 9-T superconducting magnet. In zero-field, $J_c$ is $3.5\times10^7$ A/$CM^2$ at 4.2 K and above $10^7$ A/$cm^2$ at 25 K. These are values comparable to the best $J_c$ reported value in the literature. The $J_c$ drops under applied magnetic fields. The rate of $J_c$ suppression by magnetic field is faster than in ex situ annealed films with substantial oxygen contamination. Because there is minimal oxygen contamination in the films formed by the present HPCVD methods, the vortex pinning is weaker than in oxygen contaminated films.

We have succeeded in growing in situ epitaxial $MgB_2$ thin films by Hybrid Physical-Chemical Vapor Deposition, a combination of Physical Vapor Deposition and Chemical Vapor Deposition. In an example of this technique, bulk pieces of Mg placed near a substrate were heated, which generates a high Mg vapor pressure necessary for in situ growth of magnesium boride thin films. Diborane was used as the boron precursor gas. The $MgB_2$ films deposited by HPCVD were grown epitaxially on (0001) sapphire and (0001) SiC substrates. Transmission electron microscopy (TEM) images of a $MgB_2$ film on a (0001) sapphire substrate show an epitaxial growth of a c-axis oriented $MgB_2$ film on the substrate. It was observed that the in-plane epitaxial relationship is that the hexagonal $MgB_2$ lattice is rotated by 30° to match the hexagonal lattice of the sapphire substrate.

With respect to forming a $MgB_2$ film on an alumina substrate, an intermediate layer at the $MgB_2/Al_2O_3$ interface was observed with high-resolution imaging. Fourier-transform studies and nano-sized probe electron diffraction reveal that the image characteristics of this layer results from a superposition of magnesium oxide (MgO) regions with the epitaxially-grown $MgB_2$ on the alumnia substrate.

Superconducting electronics using $MgB_2$ can employ a multilayer junction technology suitable for modern microprocessing conditions. For example, producing a Josephson junction involves forming a $MgB_2$ layer followed by a conductive layer, such as from a normal metal, or insulator layer, and finally covered by a counter electrode, either of $MgB_2$ or other materials. The thickness and area of the thin film can be those dimensions typically used in these devices.

The morphology and electrical properties of thin film surfaces are factors for $MgB_2$ Josephson junctions. These includes the smoothness of the $MgB_2$ layer, the coverage of the non-superconducting layer, the electrical properties of the $MgB_2$ surface after processing steps such as photolithography and chemical etching or ion milling, the uniformity of the electrical properties, etc.

Josephson junctions from multilayer structures including a $MgB_2$ layer can be fabricated with aspects of the present invention. The Josephson junctions can be characterized by measuring its I-V curves, from which the gap parameter can be determined. It is believed that the junction measurement can be closely coupled to the HPCVD deposition to optimized the device characteristics.

It is believed that the HPCVD technique is among the most successful in situ deposition technique for boride thin films. The epitaxial films produced by HPCVD have excellent superconducting properties with small roughness, which is applicable to Josephson junctions. Furthermore, the in situ process can be readily scaled up to deposit over large substrate areas and provides for multilayer heterostructure fabrication. It is believed that the fabrication process can reproducibly provide $MgB_2$ Josephson junctions with desirable characteristics and uniform device parameters across large wafers.

The present invention enjoys industrial applicability in manufacturing various types of thin films, particularly thin films of conducting and superconducting materials for microelectronics efficiently and substantially free of oxide impurities and in a process that improves the conductivity properties of the material.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of forming a thin film on a substrate, the method comprising:
   physically generating vapor from at least one source material, which is within a chamber with a substrate; and
   introducing at least one boron containing precursor to the chamber, which combines with the vapor from the at least one source material to form a boride containing thin film from the combined precursor and source material on the substrate.

2. The method of claim 1, comprising introducing a carrier gas to the chamber prior to, during, or after introducing the precursor.

3. The method of claim 2, wherein the carrier gas contains hydrogen.

4. The method of claim 1, comprising maintaining a pressure of about 100 to about 700 Torr in the chamber during formation of the thin film on the substrate.

5. The method of claim 1, comprising heating the at least one source material to a temperature of about 20° C. to about 900° C. to physically generate vapor of the at least one source material.

6. The method of claim 1, comprising maintaining a distance of no less than several inches between the substrate and the at least one source material while physically generating vapor from the at least one source material.

7. The method of claim 1, wherein the boron containing precursor is boron trichloride, boron tribromide, diborane, trimethylboron, boron trifluoride, or any combination thereof.

8. The method of claim 1, comprising physically generating vapor from a material consisting of magnesium, calcium, titanium, lanthanide, strontium, a lanthanide metal and alloys thereof as the at least one source material.

9. A method of forming a thin film on a substrate, the method comprising:

physically generating vapor from at least one source material, which is within a chamber with a substrate; and introducing at least one precursor to the chamber, which combines with the vapor from the at least one source material to form a thin film from the combined precursor and source material on the substrate while maintaining a pressure of 1 to 1,000 Torr in the chamber during formation of the thin film on the substrate.

10. The method of claim 9, comprising heating the at least one source material to a temperature of 20° C. to 120° C. to physically generate vapor of the at least one material.

11. The method of claim 9, comprising physically generating the vapor of the source material thermally, or by a pulsed laser.

12. The method of claim 9, comprising physically generating magnesium vapor from a magnesium source as the at least one source material, introducing a boron containing compound to the chamber as the precursor, introducing a carrier gas to the chamber along with the boron containing compound, and forming a magnesium boride film as the thin film on the substrate.

13. The method of claim 3, comprising:

physically generating magnesium vapor from a magnesium source as the at least one source material;

introducing diborane to the chamber as the precursor; and forming a magnesium diboride film as the thin film on the substrate.

14. The method of claim 1, comprising maintaining a distance of about several mm to about several inches between the substrate and the at least one source material while physically generating vapor from the at least one source material.

15. The method of claim 13, comprising forming an epitaxial magnesium diboride thin film as the thin film on the substrate.

* * * * *

UNITED STATES PATENT AND TRADEMARK OFFICE
CERTIFICATE OF CORRECTION

PATENT NO. : 6,797,341 B2
DATED : September 28, 2004
INVENTOR(S) : Xianghui Zeng et al.

It is certified that error appears in the above-identified patent and that said Letters Patent is hereby corrected as shown below:

<u>Column 1,</u>
Line 3, insert
-- <u>Government Interest in the Invention</u>
The subject matter of this disclosure was made with support from the Government under Contract No. N00014-00-1-029. The Government may have certain rights in this invention. --.

Signed and Sealed this

Tenth Day of May, 2005

JON W. DUDAS
*Director of the United States Patent and Trademark Office*